(12) United States Patent
Zhou et al.

(10) Patent No.: US 11,004,935 B2
(45) Date of Patent: May 11, 2021

(54) SOLID POWER SEMICONDUCTOR FIELD EFFECT TRANSISTOR STRUCTURE

(71) Applicant: Wai Yee Liu, Hong Kong (CN)

(72) Inventors: Xianda Zhou, Hong Kong (CN); Wai Yee Liu, Hong Kong (CN); Johnny Kin On Sin, Hong Kong (CN)

(73) Assignee: Wai Yee Liu, Hong Kong (CN)

( * ) Notice: Subject to any disclaimer, the term of this patent is extended or adjusted under 35 U.S.C. 154(b) by 409 days.

(21) Appl. No.: 15/774,536

(22) PCT Filed: Mar. 22, 2016

(86) PCT No.: PCT/CN2016/076952
§ 371 (c)(1),
(2) Date: May 8, 2018

(87) PCT Pub. No.: WO2017/161489
PCT Pub. Date: Sep. 28, 2017

(65) Prior Publication Data
US 2020/0266273 A1 Aug. 20, 2020

(51) Int. Cl.
*H01L 29/08* (2006.01)
*H01L 29/06* (2006.01)
(Continued)

(52) U.S. Cl.
CPC ...... *H01L 29/0847* (2013.01); *H01L 29/0615* (2013.01); *H01L 29/1095* (2013.01); *H01L 29/7802* (2013.01); *H01L 29/7816* (2013.01)

(58) Field of Classification Search
CPC ......... H01L 29/66674; H01L 29/66712; H01L 29/7801; H01L 29/7802; H01L 29/0852; H01L 29/0856; H01L 29/086; H01L 29/0865; H01L 29/0873; H01L 29/0878; H01L 29/0882; H01L 29/1095; H01L 29/7811; H01L 29/7816; H01L 29/0615–0634; H01L 29/1041–1054;
(Continued)

(56) References Cited

U.S. PATENT DOCUMENTS

2007/0120170 A1* 5/2007 Niedernostheide ......................... H01L 29/0878 257/302
2007/0120201 A1* 5/2007 Yamaguchi ......... H01L 29/0634 257/401

(Continued)

FOREIGN PATENT DOCUMENTS

CN 1539169 A 10/2004
CN 101442074 A 5/2009
(Continued)

OTHER PUBLICATIONS

International Search Report (English and Chinese) and Written Opinion issued in PCT/CN2016/076952, dated Dec. 30, 2016, 11 pages.

*Primary Examiner* — Sonya McCall-Shepard
(74) *Attorney, Agent, or Firm* — Hamre, Schumann, Mueller & Larson, P.C.

(57) ABSTRACT

The present invention discloses a rugged power semiconductor field effect transistor structure, and through a special design, it solves the problem that the activation under a transient condition may result in failures on the device, so that there is no parasitic BJT, and thus the device is more rugged.

19 Claims, 5 Drawing Sheets

(51) Int. Cl.
  *H01L 29/10* (2006.01)
  *H01L 29/78* (2006.01)
  *H01L 29/423* (2006.01)
  *H01L 29/739* (2006.01)

(58) Field of Classification Search
  CPC .............. H01L 29/0891; H01L 29/0895; H01L 29/1033; H01L 29/1037; H01L 29/1058; H01L 29/1066; H01L 29/1075; H01L 29/1079
  See application file for complete search history.

(56) References Cited

U.S. PATENT DOCUMENTS

| | | | |
|---|---|---|---|
| 2007/0170436 A1* | 7/2007 | Sugawara | H01L 29/417 257/77 |
| 2012/0217577 A1* | 8/2012 | Hashimoto | H01L 29/0856 257/330 |
| 2014/0073123 A1* | 3/2014 | Meiser | H01L 29/51 438/586 |
| 2015/0115355 A1* | 4/2015 | Hirler | H01L 29/1095 257/331 |

FOREIGN PATENT DOCUMENTS

| | | |
|---|---|---|
| CN | 201425941 Y | 3/2010 |
| CN | 101894865 A | 11/2010 |
| CN | 103137494 A | 6/2013 |
| CN | 104979386 A | 10/2015 |
| WO | 0019540 A1 | 4/2000 |

* cited by examiner

Prior Art

SOLID POWER SEMICONDUCTOR FIELD EFFECT TRANSISTOR STRUCTURE

BACKGROUND

Technical Field

The present invention discloses a power semiconductor device structure, and in particular, relates to a rugged power semiconductor field effect transistor structure.

Related Art

Figure 1:
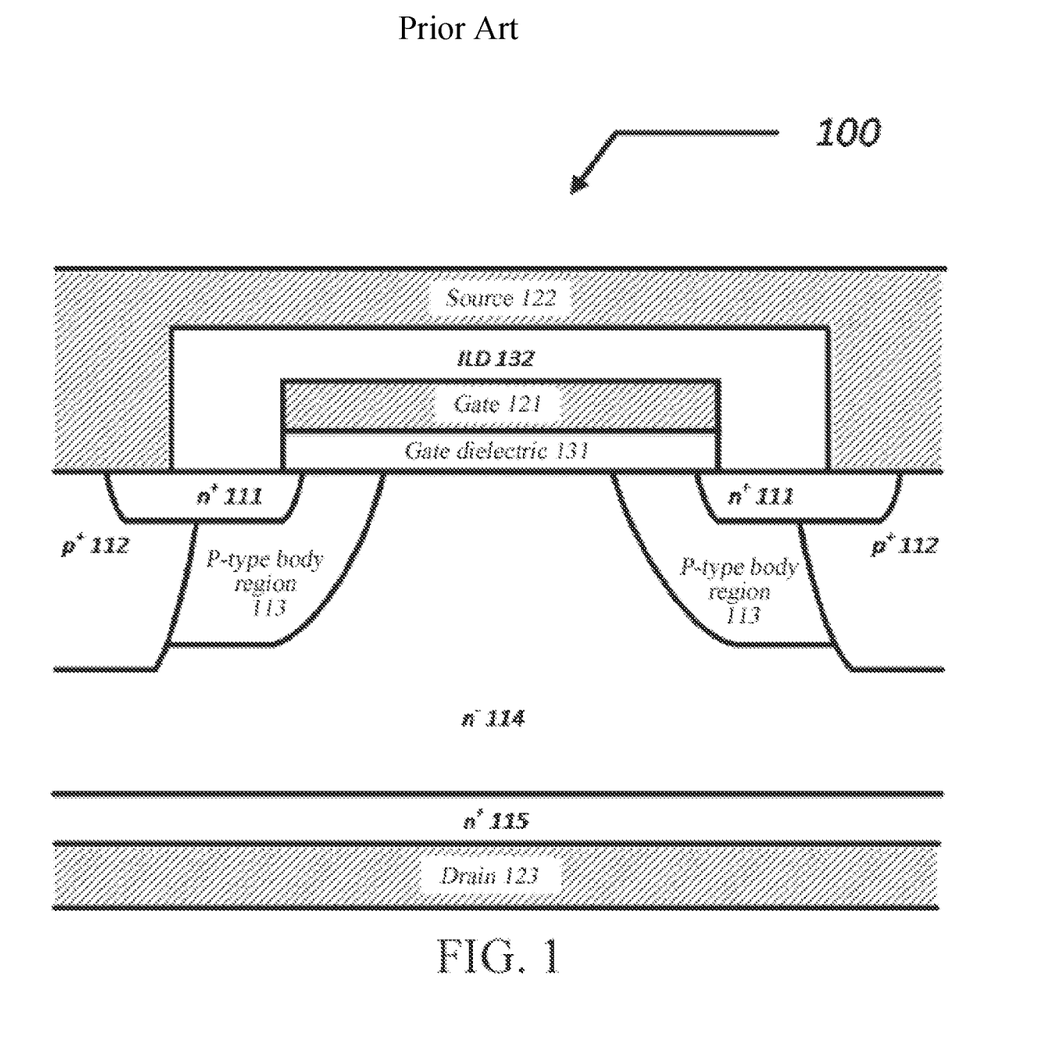
FIG. 1 is a cross-sectional view of the VDMOS structure in the prior art.

Power semiconductor switching devices have been widely used in power electronic systems, such as switching power supplies and motor drives. In these applications, such devices are often required to be highly rugged. As shown in FIG. 1, a cross section of the structure of a prior art power semiconductor device is given. The device of the structure shown in FIG. 1 is commonly called as the vertical double diffused metal oxide semiconductor field effect transistor (i.e. VDMOS). A drain electrode 123 is provided at the very bottom of the device 100 of the field effect transistor. An $n^+$ drain 115 (i.e. heavily doped n-type region drain) is provided at the top of the drain electrode 123. An $n^-$ drift region 114 (i.e. lightly doped n-type region drift region) is provided at the top of the $n^+$ drain 115. The upper surface of the $n^-$ drift region 114 is partially surrounded by a p-type body region 113. On the periphery of the p-type body 113 is the $p^+$ diffusion region 112 (i.e. heavily doped p-type region diffusion region) for connecting the p-type body region 113 to the source electrode 122. On the upper surface of the p-type body 113 an $n^+$ source 111 (i.e. heavily doped n-type region source) is provided. The surface of the p-type body region 113 is covered by a gate dielectric 131, and hence forming a channel between the $n^-$ drift region 114 and the $n^+$ source 111. A gate electrode 121 is provided at the top of the gate dielectric 131, an interlayer dielectric 132 (i.e. ILD) is provided at the top of the gate electrode 121 for separating the gate electrode 121 from the source electrode 122, and a source electrode 122 is provided outside the interlayer dielectric 132 for short-connecting the $n^+$ source 111 and the $p^+$ diffusion region 112.

When the body 100 of the field effect transistor is at on-state, the surface of the p-type body region 113 is inverted through positive gate voltage and then the current can be conducted between the $n^+$ source 111 and the $n^-$ drift region 114; and when the body 100 of the field effect transistor is at off-state, the current is blocked by the reverse biased junction between the p-type body region 113 and the $n^-$ drift region 114. Because the $n^+$ source 111, the p-type body region 113 and the $n^-$ drift region 114 are all essential parts of the structure, so the parasitic $n^+$ source 111, p-type body region 113 and $n^-$ drift region 114 BJT always exists in the structure of the device 100 of field effect transistor. Under a transient state, for example, under unclamped inductive switching, the parasitic BJT can be activated by the transient current flowing through the resistance of the p-type body region 113. The activation of the parasitic BJT is commonly called as the second breakdown which can result in failures like thermal runaway on the device 100 of the field effect transistor. Currently, the VDMOS has been widely used in electronic systems, however, the parasitic $n^+$ source 111, p-type body region 113 and $n^-$ drift region 114 bipolar junction transistor (BJT) generally exists in such structure, and the activation of parasitic BJT under a transient condition can result in failures on the device. Such transient conditions generally include but are not limited to avalanche operations, reverse recovery of the body diode and single events induced by cosmic radiation, which are often encountered in applications. Since the parasitic BJT exists in all VDMOS structures, so the related failures can only be suppressed but cannot be eliminated.

SUMMARY

To overcome the above-mentioned shortcoming in the prior art that the $n^+$ source, the p-type body region and the $n^-$ drift region are all essential parts of the structure of the field effect transistor, and the activation under a transient condition may result in failures on the device, the present invention provides a rugged power semiconductor field effect transistor structure. The structure is specially designed to have no parasitic BJT, and thus the device is more rugged.

The technical solution adopted in the present invention to solve the technical problem is as follows: a rugged power semiconductor field effect transistor structure is provided, wherein the very bottom of the transistor structure is provided with a drain electrode, a heavily doped drain region of a first conductivity type is provided at the top of the drain electrode, a lightly doped drift region of the first conductivity type is provided at the top of the heavily doped drain region of the first conductivity type, a heavily doped source region of a second conductivity type is provided on and covers part of the upper surface of the lightly doped drift region of the first conductivity type, a gate dielectric is provided at the top of the lightly doped drift region of the first conductivity type and the heavily doped source region of the second conductivity type, which covers above the lightly doped drift region of the first conductivity type and part of the top of the heavily doped source region of the second conductivity type, a gate electrode is provided at the top of the gate dielectric, an interlayer dielectric is provided at the top of the gate electrode, which covers above the gate electrode and contacts the upper surface of the heavily doped source region of the second conductivity type, and a source electrode covers the top of the interlayer dielectric, which contacts the heavily doped source region of the second conductivity type and is separated from the gate electrode by the interlayer dielectric.

A rugged power semiconductor field effect transistor structure is provided, wherein the very bottom of the transistor structure is provided with an emitter electrode, a heavily doped emitter region of a second conductivity type is provided at the top of the emitter electrode, a lightly doped base region of a first conductivity type is provided at the top of the heavily doped emitter region of the second conductivity type, a heavily doped collector region of the second conductivity type is provided on and covers part of the upper surface of the lightly doped base region of the first conductivity type, a gate dielectric is provided at the top of the lightly doped base region of the first conductivity type and the heavily doped collector region of the second conductivity type, which covers above the lightly doped base region of the first conductivity type and part of the top of the heavily doped collector region of the second conductivity type, a gate electrode is provided at the top of the gate dielectric, an interlayer dielectric is provided at the top of the gate electrode, which covers above the gate electrode and contacts the upper surface of the heavily doped collector region of the second conductivity type, and a collector electrode covers the top of the interlayer dielectric, which contacts the heavily doped collector region of the second conductivity type and is separated from the gate electrode by the interlayer dielectric.

The technical solution adopted in the present invention to solve the technical problem further includes the following:

The heavily doped drain region of the first conductivity type has a doping concentration of between $1 \times 10^{19}$ cm$^{-3}$ and $1 \times 10^{21}$ cm$^{-3}$.

The lightly doped drift region of the first conductivity type has a doping concentration of between $1 \times 10^{13}$ cm$^{-3}$ and $1 \times 10^{17}$ cm$^{-3}$.

The lightly doped drift region of the first conductivity type has a length of between 1 μm and 100 μm.

The heavily doped source region of the second conductivity type has a doping concentration of between $1 \times 10^{19}$ cm$^{-3}$ and $1 \times 10^{21}$ cm$^{-3}$.

The heavily doped source region of the second conductivity type has a depth of between 0.01 μm and 1 μm.

The pn junction between the heavily doped source region of the second conductivity type and the lightly doped drift region of the first conductivity type is overlapped by the gate dielectric and the gate, forming a gate-controlled channel.

The doping concentration of the heavily doped source region of the second conductivity type decreases exponentially at a rate of more than 10 times/nm towards the lightly doped drift region of the first conductivity type.

The gate dielectric and the gate are located in a trench.

The heavily doped emitter region of the second conductivity type has a doping concentration of between $1 \times 10^{18}$ cm$^{-3}$ and $1 \times 10^{21}$ cm$^{-3}$.

The lightly doped base region of the first conductivity type has a doping concentration of between $1 \times 10^{13}$ cm$^{-3}$ and $1 \times 10^{17}$ cm$^{-3}$.

The lightly doped base region of the first conductivity type has a length of between 10 μm and 1000 μm.

The doping concentration of the lightly doped base region of the first conductivity type near the heavily doped emitter region of the second conductivity type is higher than that in other areas of the lightly doped base region of the first conductivity type.

The heavily doped collector region of the second conductivity type has a doping concentration of between $1 \times 10^{19}$ cm$^{-3}$ and $1 \times 10^{21}$ cm$^{-3}$.

The heavily doped collector region of the second conductivity type has a depth of between 0.01 μm and 1 μm.

The pn junction between the heavily doped collector region of the second conductivity type and the lightly doped base region of the first conductivity type is overlapped by the gate dielectric and the gate, forming a gate-controlled channel.

The doping concentration of the heavily doped collector region of the second conductivity type decreases exponentially at a rate of more than 10 times/nm towards the lightly doped base region of the first conductivity type.

The gate dielectric and the gate are located in a trench.

The beneficial effect of the present invention is that the present invention solves the problem that the activation under a transient condition may result in failures on the device through a special design, so that there is no parasitic BJT, and thus the device is more rugged.

The present invention is further described below in combination with the attached drawings and specific embodiments.

DETAILED DESCRIPTION

The present embodiment is a preferred embodiment of the present invention, and any other embodiments of which principle and basic structure are the same as or similar to that of the present embodiment shall fall within the scope of protection of the present invention.

In the present embodiment, the n channel device will be used for making specific descriptions on the structure of the present invention, but it will be understood in the structure descriptions below, that the structure provided in the present invention is also applicable to the p channel device.

In the descriptions of the present invention, the heavily doped n-type region is labeled as n$^+$ and the heavily doped p-type region is labeled as p$^+$, and these heavily doped regions often have a doping concentration of between $1 \times 10^{19}$ cm$^{-3}$ and $1 \times 10^{21}$ cm$^{-3}$; the lightly doped n-type region is labeled as n$^-$ and the lightly doped p-type region is labeled as p$^-$, and these lightly doped regions often have a doping concentration of between $1 \times 10^{13}$ cm$^{-3}$ and $1 \times 10^{17}$ cm$^{-3}$.

Embodiment 1

Figure 2:
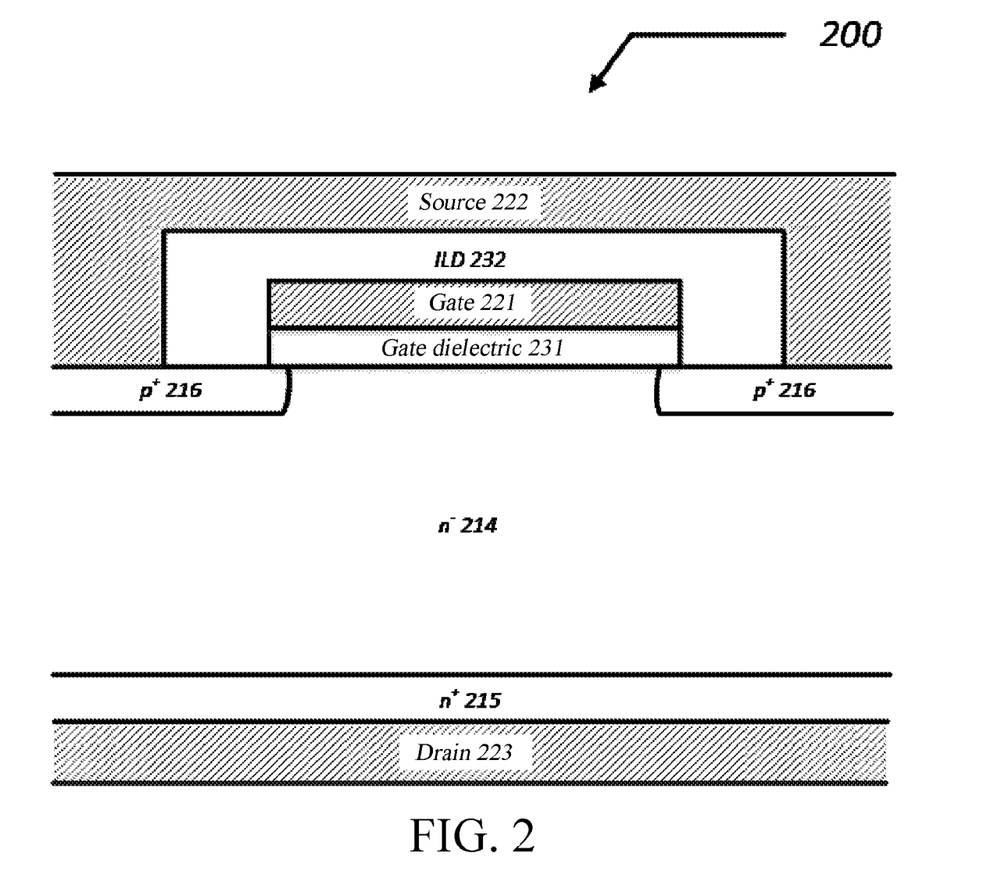
FIG. 2 is a structural diagram of the cross-section in embodiment 1 of the present invention.

Please refer to FIG. 2. In the present embodiment, a drain electrode 223 is provided at the very bottom of the device 200 of the field effect transistor, an n$^+$ drain 215 is provided at the top of the drain electrode 223, a n$^-$ drift region 214 is provided at the top of the n$^+$ drain 215, a p$^+$ source 216 is provided on part of the upper surface of the n$^-$ drift region 214, and in the present embodiment, there are two p$^+$ sources 216 which are set symmetrically, and covering part of the upper surface of the n$^-$ drift region 214, a gate dielectric 231 is provided at the top of the n$^-$ drift region 214 and the p$^+$ source 216, which covers above the n$^-$ drift region 214 and part of the top of the p$^+$ source 216, a gate electrode 221 is provided at the top of the gate dielectric 231, an interlayer dielectric 232 (ILD) is provided at the top of the gate electrode 221, and in the present embodiment, the cross section of the interlayer dielectric 232 shows a "concave" shape, which covers above the gate electrode 221 and contacts the upper surface of the p$^+$ source 216, and a source electrode 222 covers the top of the interlayer dielectric 232, which contacts the p$^+$ source 216 and is separated from the gate electrode 221 by the interlayer dielectric 232.

In the present embodiment, as shown in FIG. 2, the pn junction between the source 216 and the drift region 214 is overlapped by the gate dielectric 231 and the gate electrode 221. After a positive high voltage, for example 10V, is applied to the gate electrode 221, electrons are accumulated on the surface of the n$^-$ drift region 214, forming an accumulation layer, the accumulation layer and the p$^+$ source 216 under the gate dielectric 231 form an abrupt n$^+$ p$^+$ junction which allows electrons in the valence band of the p$^+$ source 216 to pass through to the conduction band of the accumulation layer (please refer to A. M. Ionescu and H. Riel's "Tunnel Field-Effect Transistors as Energy-Efficient Electronic Switches", Nature, Volume 479, pp 329 to 337, November 2011). Due to electron tunneling, the current can be conducted between the p⁺ source 216 and the n⁻ drift region 214. When the body 200 of the field effect transistor is at off-state, only the n⁻p⁺ junction exists between the p⁺ source 216 and the n⁻ drift region 214, and the current is blocked by the reverse biased n⁻p⁺ junction. As shown in the cross-section of the device 200 of the field effect transistor, no parasitic BJT exists in the structure, and the device 200 of the field effect transistor is immune to the failures caused by second breakdown unconditionally, and therefore the immunity to disturbance is improved, so the field effect transistor provided in the present invention is more rugged than that of the prior art.

In the present embodiment, the device 200 of the field effect transistor can switch its status by controlling the pn junction between the p⁺ source 216 and the n⁻ drift region 214. In order to conduct sufficient current under the on-state like 100 A/cm², the abrupt n⁺ p⁺ junction should be implemented, for example, at the pn junction, the doping concentration of the p⁺ source 216 should decrease exponentially at a rate of more than 1 decade/nm towards the n⁻ drift region 214; and on the other hand, the peak concentration of the p⁺ source 216 is generally about $10^{20}$ cm⁻³. To minimize the parasitic resistance of the n⁻ drift region 214 between two adjacent p⁺ sources 216, the depth of the p⁺ source 216 can be designed to be small. By use of advanced manufacturing technology, the depth of the p⁺ source 216 can be less than 1 μm but should be larger than 0.01 μm so as to ensure that the resistance of the p⁺ source 216 will not be too high. To block the current under the off-state, electron tunneling should be prevented at the n⁻ drift region 214. Because the n⁻ drift region 214 needs to maintain the blocking voltage, so in fact, the above requirements can be always met. The doping concentration of the drift region 214 is generally less than $10^{17}$ cm⁻³, which will hardly induce any tunneling current under the off-state. To realize the required blocking voltage of the device 200 of the field effect transistor, the n⁻ drift region 214 generally has a doping concentration of between $1\times10^{13}$ cm⁻³ and $1\times10^{17}$ cm⁻³, and its length is generally between 1 μm and 100 μm. In the present invention, the heavily doped n⁺ drain 215 is a preferred one in the device 200 of the field effect transistor. A high doping concentration can result in a small parasitic resistance required by the n⁺ drain 215.

Embodiment 2

Figure 3:
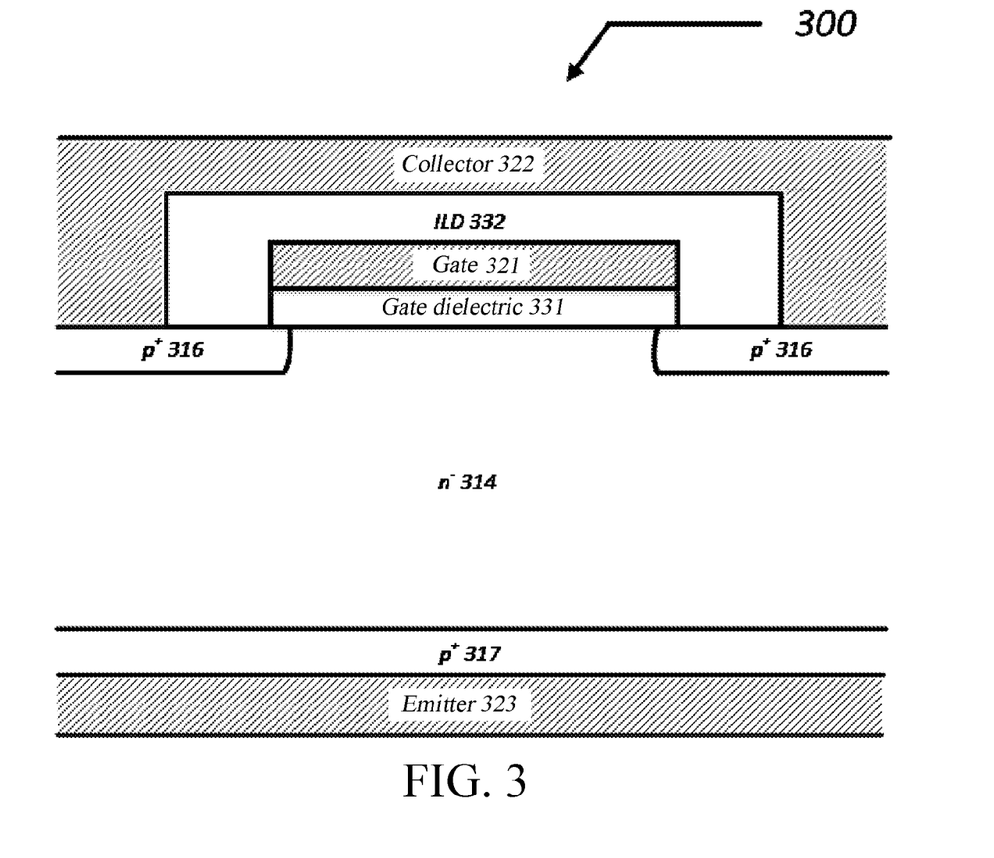
FIG. 3 is a structural diagram of the cross-section in embodiment 2 of the present invention.

Please refer to FIG. 3. The present embodiment provides a gate-controlled PNP bipolar junction transistor (BJT). An emitter electrode 323 is provided at the very bottom of the body 300 of the field effect transistor, a p⁺ emitter 317 is provided at the top of the emitter electrode 323, a n⁻ base 314 is provided at the top of the p⁺ emitter 317, a p⁺ collector 316 is provided on part of the upper surface of the n⁻ base 314, and in the present embodiment, there are two p⁺ collectors 316 which are set symmetrically and cover part of the upper surface of the n⁻ base 314, a gate dielectric 331 is provided at the top of the n⁻ base 314 and the p⁺ collector 316, which covers above the n⁻ base 314 and part of the top of the p⁺ collector 316, a gate electrode 321 is provided at the top of the gate dielectric 331, an interlayer dielectric 332 (ILD) is provided at the top of the gate electrode 321, in the present embodiment, the cross section of the interlayer dielectric 332 shows a "concave" shape, which covers above the gate electrode 321 and contacts the upper surface of the p⁺ collector 316, and a collector electrode 322 covers the top of the interlayer dielectric 332, which contacts the p⁺ collector 316 and is separated from the gate electrode 321 by the interlayer dielectric 332.

As compared with embodiment 1, the present embodiment provides a relatively low conduction loss based on the conductivity modulation in the lightly doped n⁻ base 314, but the switching speed of the device 300 of the field effect transistor is also relatively slow because of the same conductivity modulation. The operation and design of the present embodiment are similar to that of embodiment 1. As shown in FIG. 3, the pn junction between the p⁺ collector 316 and the n⁻ base 314 is overlapped by the gate dielectric 331 and the gate electrode 321. After a positive high voltage, for example 15V, is applied to the gate electrode 321, electrons are accumulated on the surface of the n⁻ base 314, and the accumulation layer and the p⁺ collector 316 under the gate dielectric 331 form an abrupt n⁺ p⁺ junction which allows electrons in the valence band of the p⁺ collector 316 to tunnel through to the conduction band of the accumulation layer. Due to electron tunneling, the current can be conducted between the p⁺ collector 316 and the n⁻ base 314; when the device 300 of the field effect transistor is at off-state, the device 300 is an open base PNP-type BJT, and the current is blocked by the reverse biased n⁻p⁺ junction between the n⁻ base 314 and the p⁺ collector 316. As shown in the cross-section of the device 300 of the field effect transistor, only one PNP-type BJT exists in the structure, and the device 300 is immune to the failures caused by a latch-up effect unconditionally.

In the present embodiment, the device 300 of the field effect transistor can switch its status by controlling the pn junction between the p⁺ collector 316 and the n⁻ base 314. In order to conduct sufficient current under the on-state like 100 A/cm², the abrupt n⁺ p⁺ junction should be implimented, for example, at the pn junction, the doping concentration of the p⁺ collector 316 should decrease exponentially at a rate of more than 1 decade/nm towards the n⁻ base 314; and on the other hand, the peak concentration of the p⁺ collector 316 is generally about $10^{20}$ cm⁻³. To minimize the parasitic resistance of the n⁻ base 314 between two adjacent p⁺ collectors 316, the depth of the p⁺ collector 316 can be designed to be small. By use of advanced manufacturing technology, the depth of the p⁺ collector 316 can be less than 1 μm but should be larger than 0.01 μm so as to ensure that the resistance of the p⁺ collector 316 will not be too high. To block the current under the off-state, electron tunneling should be prevented at the lightly doped n⁻ base region 314. Because the lightly doped n⁻ base region 314 needs to maintain the blocking voltage, so in fact, the above requirements can be always met. The doping concentration of the n⁻ base region 314 is generally less than $10^{17}$ cm⁻³, which will hardly induce any tunneling current under the off-state. To realize the required blocking voltage of the device, the n⁻ base region 314 generally has a doping concentration of between $1\times10^{13}$ cm⁻³ and $1\times10^{17}$ cm⁻³, and its depth is generally between 10 μm and 1000 μm. In addition, the doping concentration of the n⁻ base region 314 can be optimized to obtain a good trade-off between the voltage drop under the on-state and the blocking voltage, for example, the doping profile of the n⁻ base region 314 can be uneven. In the n⁻ base region 314, in order to prevent punch-through under the blocking state, the doping concentration near the p⁺ emitter 317 can be relatively high, which can reduce the length of the n⁻ base region 314 without substantially losing the blocking voltage. The reduction in the length of the n⁻ base region 314 can result in reduction in the voltage drop under the on-state. The structure of the heavily doped p+ emitter 317 is a preferred one in the device 300 of the field effect transistor. The heavily doped p+ emitter 317 can inject holes into the n− base region 314 under the connected state, which leads to the conductivity modulation in the n− base region 314 and a small voltage drop under the on-state. Generally, the doping concentration of the p+ emitter 317 is between $1\times10^{18}$ cm$^{-3}$ and $1\times10^{21}$ cm$^{-3}$.

Embodiment 3

Figure 4:
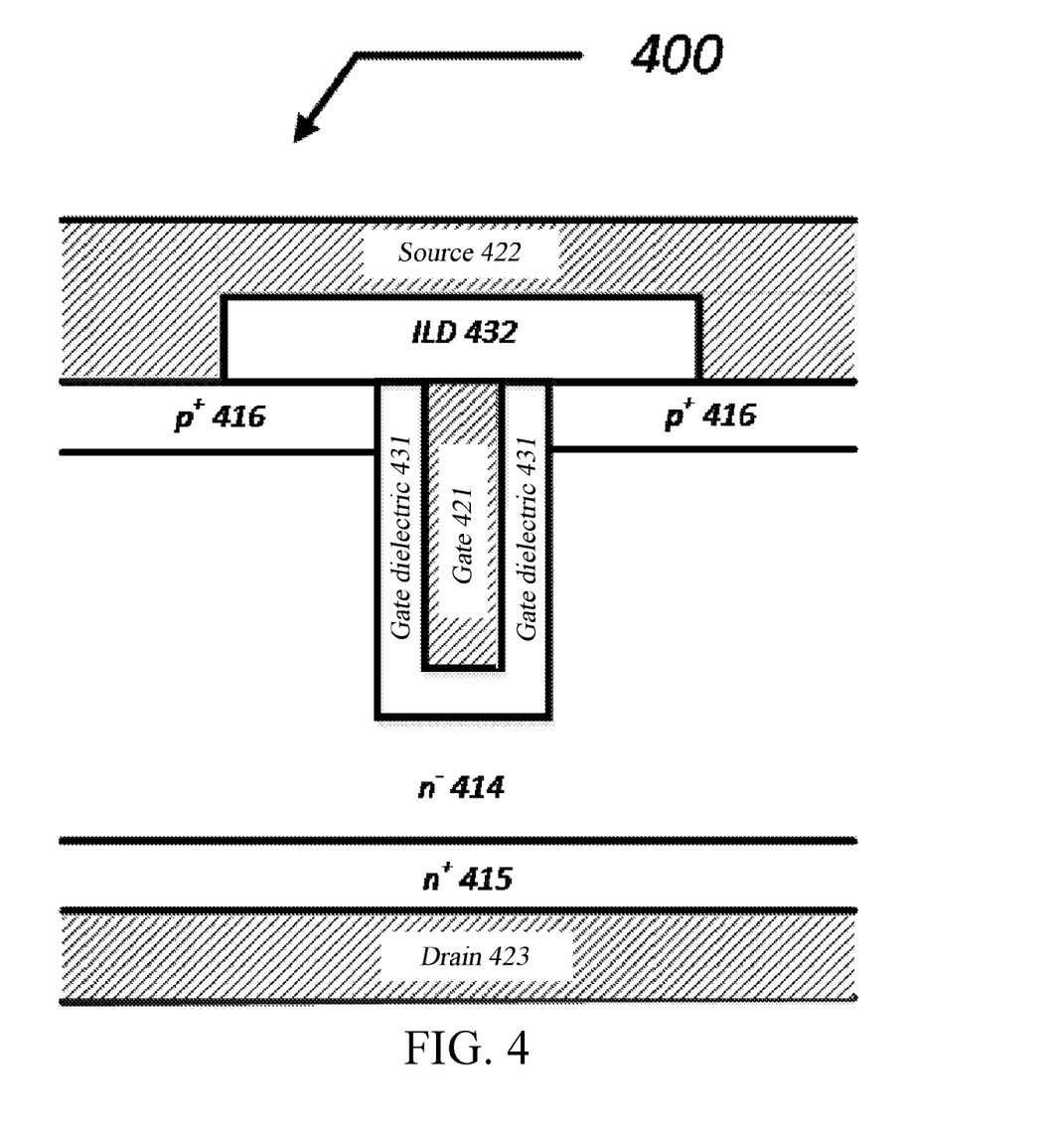
FIG. 4 is a structural diagram of the cross-section in embodiment 3 of the present invention.

Please refer to FIG. 4. The structure of the present embodiment is similar to that of embodiment 1. In the present embodiment, a trench gate is provided in the n− drift region 414, and the gate dielectric 431 and the gate electrode 421 are located in the trench. The trench gate structure can lead to reduction in the gate distance between cells of the device and reduction of the on-resistance.

Embodiment 4

Figure 5:
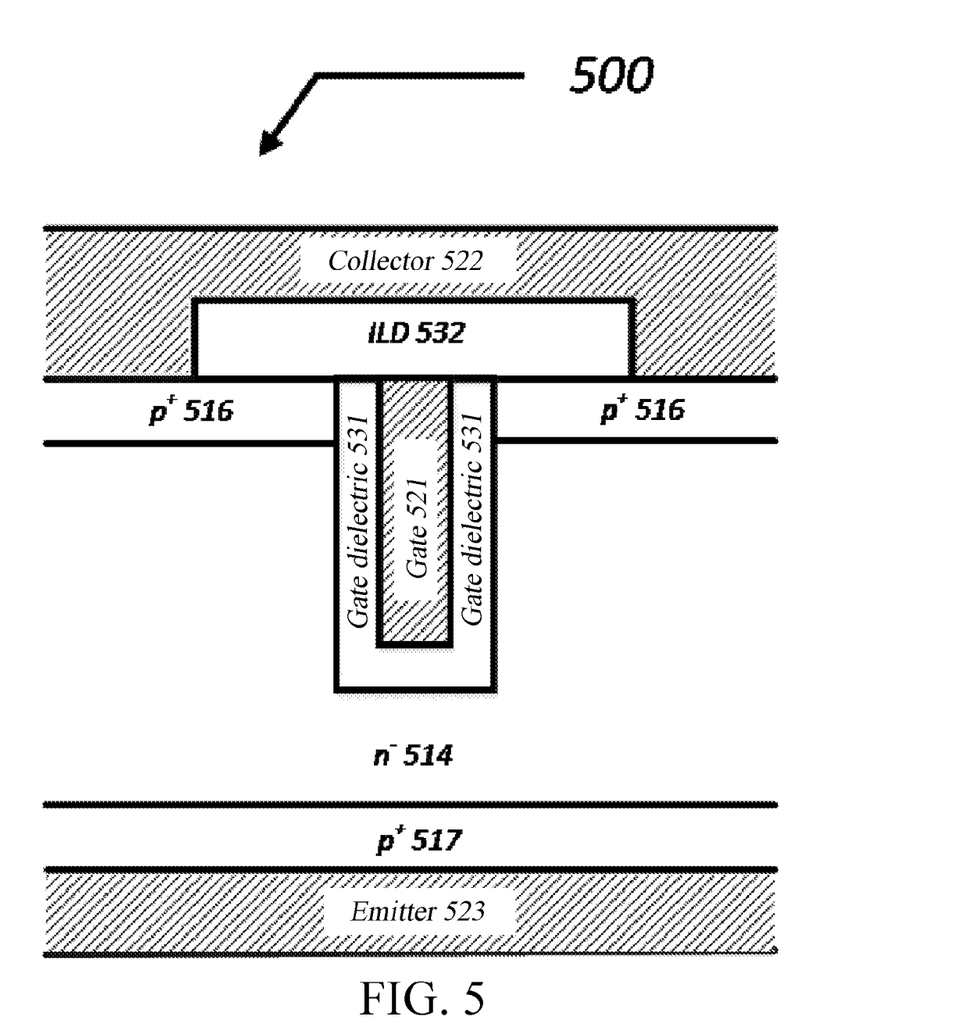
FIG. 5 is a structural diagram of the cross-section in embodiment 4 of the present invention.

Please refer to FIG. 5. The structure of the present embodiment is similar to that of embodiment 2. In the present embodiment, a trench gate is provided in the n− base region 514, and the gate dielectric 531 and the gate electrode 521 are located in the trench. The trench gate structure can lead to reduction in the area of the pn junction between the n− base region 514 and the p+ collector 516. This reduced junction area can inhibit the drift current of the hole under the on-state here, thereby inducing electron-hole pairs of high concentration which can result in the required reduced voltage drop under the on-state.

The present invention solves the problem that the activation under a transient condition may result in failures on the device through a special design, so that there is no parasitic BJT, and thus the device is more rugged.

What is claimed is:

1. A rugged power semiconductor field effect transistor structure, wherein the very bottom of the transistor structure is provided with a drain electrode, and a heavily doped drain region of a first conductivity type is provided at the top of the drain electrode, a lightly doped drift region of the first conductivity type is provided at the top of the heavily doped drain region of the first conductivity type, a heavily doped source region of a second conductivity type is provided on and covers part of the upper surface of the lightly doped drift region of the first conductivity type, a gate dielectric is provided at the top of the lightly doped drift region of the first conductivity type and the heavily doped source region of the second conductivity type, which covers above the lightly doped drift region of the first conductivity type and part of the top of the heavily doped source region of the second conductivity type, a gate electrode is provided at the top of the gate dielectric, an interlayer dielectric is provided at the top of the gate electrode, which covers above the gate electrode and contacts the upper surface of the heavily doped source region of the second conductivity type, and a source electrode covers the top of the interlayer dielectric, which contacts the heavily doped source region of the second conductivity type and is separated from the gate electrode by the interlayer dielectric.

2. The rugged power semiconductor field effect transistor structure according to claim 1, wherein the heavily doped drain region of the first conductivity type has a doping concentration of between $1\times10^{19}$ cm$^{-3}$ and $1\times10^{21}$ cm$^{-3}$.

3. The rugged power semiconductor field effect transistor structure according to claim 1, wherein the lightly doped drift region of the first conductivity type has a doping concentration of between $1\times10^{13}$ cm$^{-3}$ and $1\times10^{17}$ cm$^{-3}$.

4. The rugged power semiconductor field effect transistor structure according to claim 1, wherein the lightly doped drift region of the first conductivity type has a length of between 1 μm and 100 μm.

5. The rugged power semiconductor field effect transistor structure according to claim 1, wherein the heavily doped source region of the second conductivity type has a doping concentration of between $1\times10^{19}$ cm$^{-3}$ and $1\times10^{21}$ cm$^{-3}$.

6. The rugged power semiconductor field effect transistor structure according to claim 1, wherein the heavily doped source region of the second conductivity type has a depth of between 0.01 μm and 1 μm.

7. The rugged power semiconductor field effect transistor structure according to claim 1, wherein the pn junction between the heavily doped source region of the second conductivity type and the lightly doped drift region of the first conductivity type is overlapped by the gate dielectric and the gate, forming a gate-controlled channel.

8. The rugged power semiconductor field effect transistor structure according to claim 1, wherein the doping concentration of the heavily doped source region of the second conductivity type decreases exponentially at a rate of more than 10 times/nm towards the lightly doped drift region of the first conductivity type.

9. The rugged power semiconductor field effect transistor structure according to claim 1, wherein the gate dielectric and the gate are located in a trench.

10. A rugged power semiconductor field effect transistor structure, wherein the very bottom of the transistor structure is provided with an emitter electrode, a heavily doped emitter region of a second conductivity type is provided at the top of the emitter electrode, a lightly doped base region of a first conductivity type is provided at the top of the heavily doped emitter region of the second conductivity type, a heavily doped collector region of the second conductivity type is provided on and covers part of the upper surface of the lightly doped base region of the first conductivity type, a gate dielectric is provided at the top of the lightly doped base region of the first conductivity type and the heavily doped collector region of the second conductivity type, which covers above the lightly doped base region of the first conductivity type and part of the top of the heavily doped collector region of the second conductivity type, a gate electrode is provided at the top of the gate dielectric, an interlayer dielectric is provided at the top of the gate electrode, which covers above the gate electrode and contacts the upper surface of the heavily doped collector region of the second conductivity type, and a collector electrode covers the top of the interlayer dielectric, which contacts the heavily doped collector region of the second conductivity type and is separated from the gate electrode by the interlayer dielectric.

11. The rugged power semiconductor field effect transistor structure according to claim 10, wherein the heavily doped emitter region of the second conductivity type has a doping concentration of between $1\times10^{18}$ cm$^{-3}$ and $1\times10^{21}$ cm$^{-3}$.

12. The rugged power semiconductor field effect transistor structure according to claim 10, wherein the lightly doped base region of the first conductivity type has a doping concentration of between $1\times10^{13}$ cm$^{-3}$ and $1\times10^{17}$ cm$^{-3}$.

13. The rugged power semiconductor field effect transistor structure according to claim 10, wherein the lightly doped base region of the first conductivity type has a length of between 10 μm and 1000 μm.

14. The rugged power semiconductor field effect transistor structure according to claim 10, wherein the doping concentration of the lightly doped base region of the first conductivity type near the heavily doped emitter region of the second conductivity type is higher than that in other areas of the lightly doped base region of the first conductivity type.

15. The rugged power semiconductor field effect transistor structure according to claim 10, wherein the heavily doped collector region of the second conductivity type has a doping concentration of between $1 \times 10^{19}$ cm$^{-3}$ and $1 \times 10^{21}$ cm$^{-3}$.

16. The rugged power semiconductor field effect transistor structure according to claim 10, wherein the heavily doped collector region of the second conductivity type has a depth of between 0.01 μm and 1 μm.

17. The rugged power semiconductor field effect transistor structure according to claim 10, wherein the pn junction between the heavily doped collector region of the second conductivity type and the lightly doped base region of the first conductivity type is overlapped by the gate dielectric and the gate, forming a gate-controlled channel.

18. The rugged power semiconductor field effect transistor structure according to claim 10, wherein the doping concentration of the heavily doped collector region of the second conductivity type decreases exponentially at a rate of more than 10 times/nm towards the lightly doped base region of the first conductivity type.

19. The rugged power semiconductor field effect transistor structure according to claim 10, wherein the gate dielectric and the gate are located in a trench.

* * * * *